(12) United States Patent
Huang et al.

(10) Patent No.: US 9,034,665 B2
(45) Date of Patent: May 19, 2015

(54) TOOL CONFIGURATION AND METHOD FOR EXTREME ULTRA-VIOLET (EUV) PATTERNING WITH A DEFORMABLE REFLECTIVE SURFACE

(71) Applicant: Taiwan Semiconductor Manufacturing Co., Ltd., Hsin-Chu (TW)

(72) Inventors: Chia-Ching Huang, Su-ao Township (TW); Tzu-Hsiang Chen, Zhubei (TW); Chia-Hao Hsu, Hsinchu (TW); Chia-Chen Chen, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 42 days.

(21) Appl. No.: 14/051,683

(22) Filed: Oct. 11, 2013

(65) Prior Publication Data

US 2015/0104745 A1    Apr. 16, 2015

(51) Int. Cl.
*G03F 7/20* (2006.01)
*G03F 1/52* (2012.01)
*H01L 21/00* (2006.01)
*G01N 21/956* (2006.01)

(52) U.S. Cl.
CPC ............ *G03F 7/20* (2013.01); *G01N 21/95684* (2013.01); *G03F 7/70291* (2013.01); *G03F 7/70266* (2013.01); *G03F 7/70191* (2013.01)

(58) Field of Classification Search
CPC ............ G03F 7/70266; G03F 7/70291; G03F 7/70191
USPC ................................ 438/7; 250/492.22, 504 R
See application file for complete search history.

(56) References Cited

U.S. PATENT DOCUMENTS

| | | | | |
|---|---|---|---|---|
| 4,875,765 A | * | 10/1989 | Vandenberg et al. | 359/849 |
| 5,684,566 A | * | 11/1997 | Stanton | 355/67 |
| 5,793,473 A | * | 8/1998 | Koyama et al. | 355/55 |
| 5,888,675 A | * | 3/1999 | Moore et al. | 430/5 |
| 5,986,795 A | * | 11/1999 | Chapman et al. | 359/224.1 |
| 6,840,638 B2 | * | 1/2005 | Watson | 359/849 |
| 6,842,277 B2 | * | 1/2005 | Watson | 359/291 |
| 6,897,940 B2 | * | 5/2005 | Sogard | 355/55 |
| 8,029,947 B2 | * | 10/2011 | Hickman | 430/5 |
| 8,284,379 B2 | * | 10/2012 | Phillips | 355/72 |
| 8,555,208 B2 | * | 10/2013 | Hickman | 716/51 |
| 2007/0253070 A1 | * | 11/2007 | Venema | 359/619 |
| 2010/0284015 A1 | * | 11/2010 | Sewell | 356/450 |
| 2011/0292363 A1 | * | 12/2011 | Ivey et al. | 355/55 |

OTHER PUBLICATIONS

U.S. Appl. No. 14/029,844, filed Sep. 18, 2013. 24 Pages.
U.S. Appl. No. 14/022,355, filed Sep. 10, 2013. 21 Pages.

* cited by examiner

*Primary Examiner* — Evan Pert
(74) *Attorney, Agent, or Firm* — Eschweiler & Associates, LLC (57) ABSTRACT

Some embodiments of the present disclosure relate to a tool configuration and method for EUV patterning with a deformable reflective surface comprising a mirror or reticle. A radiation source provides EUV radiation which is reflected off the deformable reflective surface to transfer a reticle pattern to a semiconductor workpiece. A metrology tool measures a residual vector formed between a first shape of the semiconductor workpiece and a second shape of the reticle pattern. And, a topology of the deformable reflective surface is changed based upon the residual vector to minimize a total magnitude of the residual vector.

20 Claims, 9 Drawing Sheets

TOOL CONFIGURATION AND METHOD FOR EXTREME ULTRA-VIOLET (EUV) PATTERNING WITH A DEFORMABLE REFLECTIVE SURFACE

BACKGROUND

The following disclosure relates to extreme ultra-violet (EUV) lithography and methods to improve reticle overlay variation while maintaining manufacturing throughput for semiconductor fabrication process.

DETAILED DESCRIPTION

The present disclosure will now be described with reference to the drawings wherein like reference numerals are used to refer to like elements throughout, and wherein the illustrated structures are not necessarily drawn to scale. It will be appreciated that this detailed description and the corresponding figures do not limit the scope of the present disclosure in any way, and that the detailed description and figures merely provide a few examples to illustrate some ways in which the inventive concepts can manifest themselves.

Figure 1:
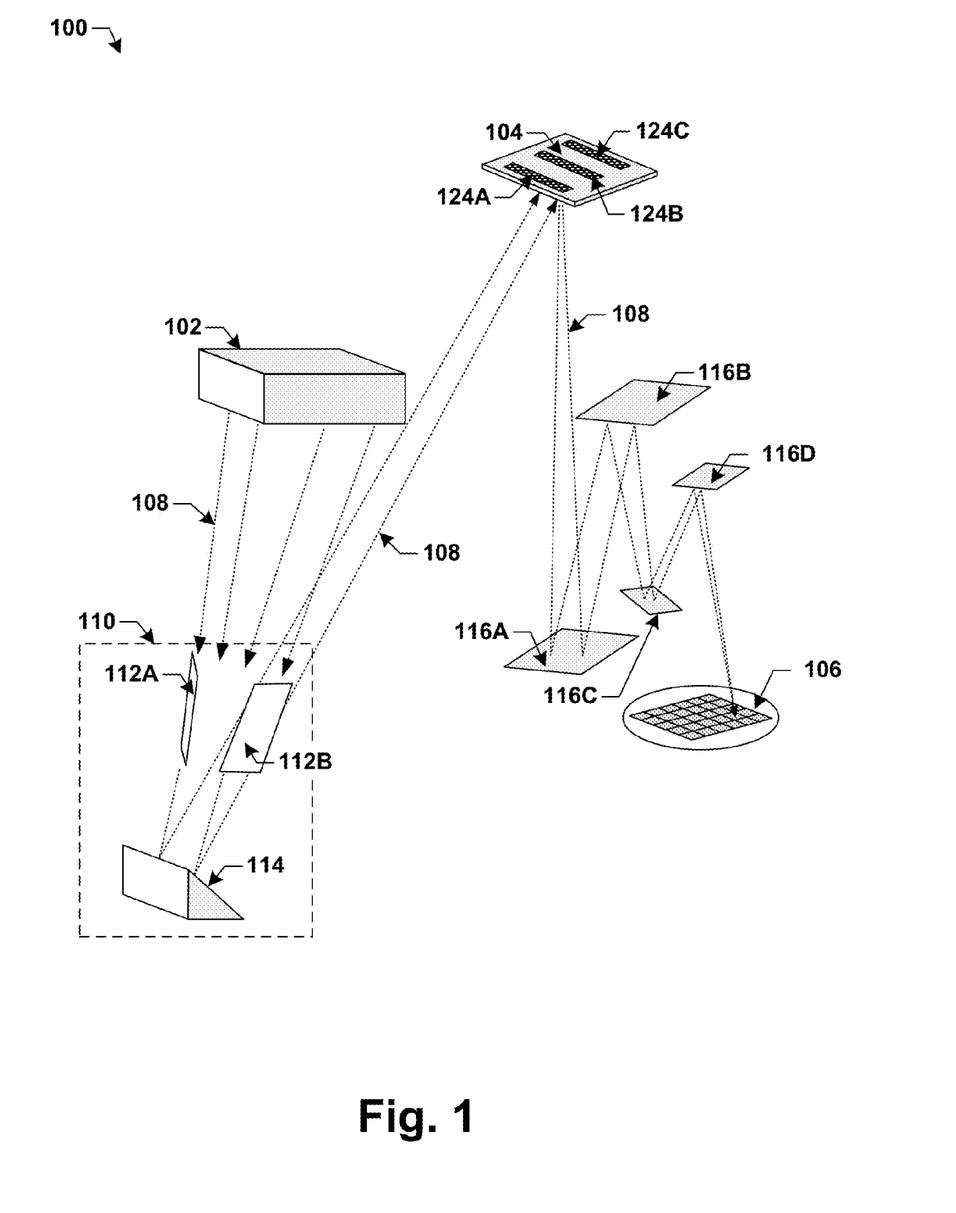
FIG. 1 illustrates a tool configuration for extreme ultra-violet (EUV) lithography.

FIG. 1 illustrates an EUV illumination tool 100, comprising a radiation source 102 (e.g., ionized Xe or Sn) configured to supply EUV radiation 108 (i.e., with wavelengths in a range of about 10 nm to about 130 nm) to a reticle 104, which reflects the EUV radiation 108 to form a pattern on a surface of a semiconductor workpiece 106. To produce the pattern, absorption features 124A-124C are placed on a front surface of the reticle 104, and configured to absorb the EUV radiation 108, such that the reflected rays of radiation 108 form the pattern on a layer of photoresist disposed on a surface of the semiconductor workpiece 106. The radiation source 102 emits EUV radiation 108 to a condenser 110, comprising first and second surfaces 112A, 112B configured to focus the EUV radiation 108, and a reflector 114 configured to reflect the EUV radiation 108 towards the reticle 104. The reticle 104 in turn reflects the EUV radiation 108 in a manner that will be described in FIG. 2B. Upon reflection by the reticle 104, the EUV radiation 108 is filtered through reduction optics comprising a series of first through fourth mirrors 116A-116D, which serve as lenses to reduce a size of the pattern carried by the EUV radiation 108.

Defects within the reticle 104 or the first through fourth mirrors 116A-116D, among other effects, may distort the reflective surface of the reticle 104 or the first through fourth mirrors 116A-116D, and result in non-uniform reflection of an incident ray, causing wavefront aberration effects. Wavefront aberration is a departure of a reflected wavefront from its ideal shape. This type of aberration in EUV lithography is enhanced by about 10 times over immersion optical lithography due to the relative impact on 13.5 nm vs. 193 nm nominal wavelength, and results in a degradation of the uniformity of the pattern when disposed on the semiconductor workpiece 106. The degradation includes such effects as across-field critical dimension (CD) shape bias, CD variation, etc., of shapes formed by the pattern.

Figure 3A:
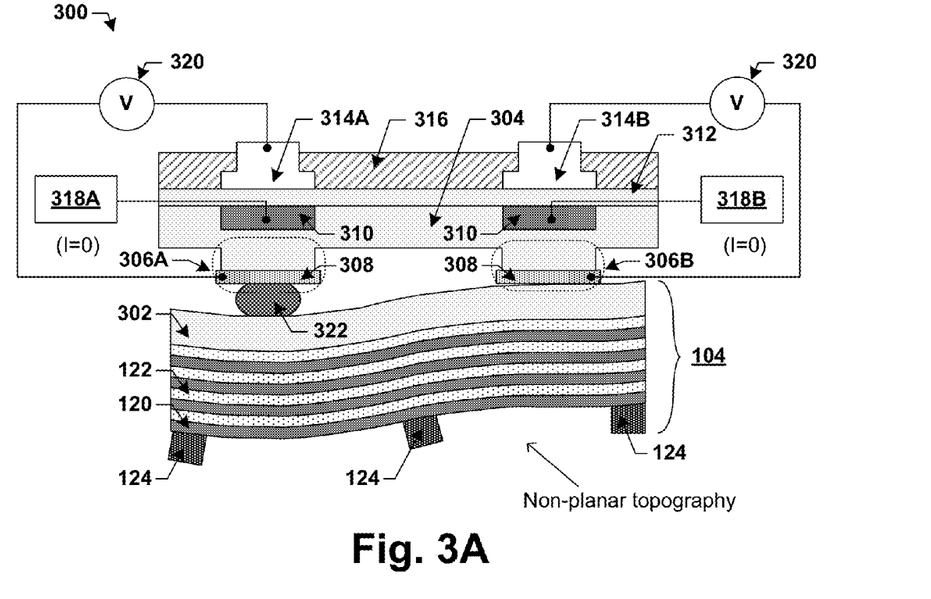
FIGS. 3A-3B illustrate some embodiments of a deformable reflective surface for EUV lithography comprising a reticle coupled to a deformable electrostatic chuck (e-chuck).
Figure 3B:
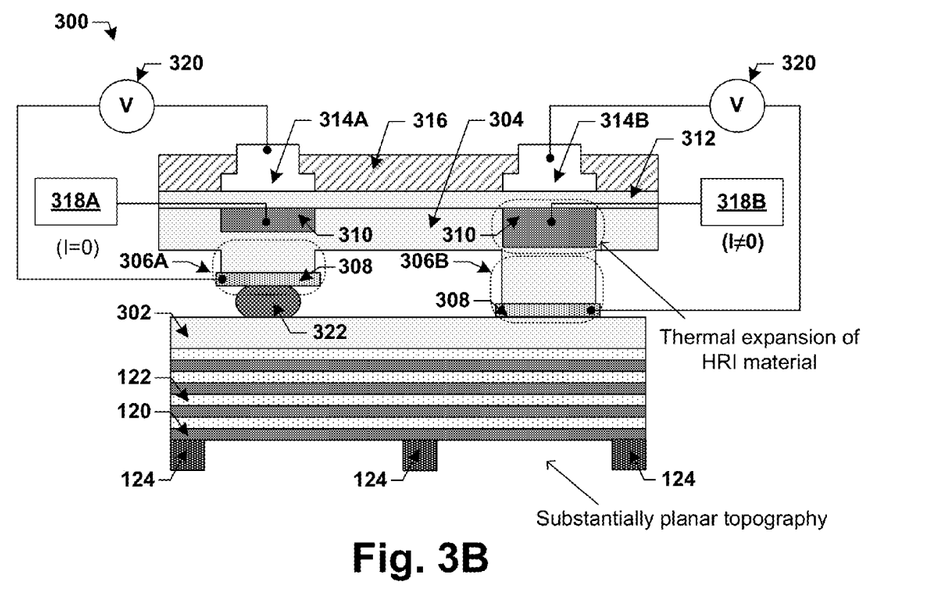

The reticle 104 is held in place by an electrostatic check ("e-chuck"), as is shown in FIG. 3. In addition to defects within the reticle 104, a clamping topography between the reticle 104 and the e-chuck can again distort the reflected wavefront, and result in overlay (OVL) error when patterning the semiconductor workpiece 106. Clamping topography can result from burl wear or contaminants on a surface of the e-chuck, which causes non-planar clamping and subsequently impacts reticle topography. This again results in degradation of the pattern uniformity.

Accordingly, some embodiments of the present disclosure relates to a tool configuration and method for EUV patterning with a deformable reflective surface comprising a mirror or reticle. A radiation source provides EUV radiation which is reflected off the deformable reflective surface to transfer a reticle pattern to a semiconductor workpiece. A metrology tool measures a residual vector formed between a first shape of the semiconductor workpiece and a second shape of the reticle pattern. And, a topology of the deformable reflective surface is changed based upon the residual vector to minimize a total magnitude of the residual vector.

Figure 2A:
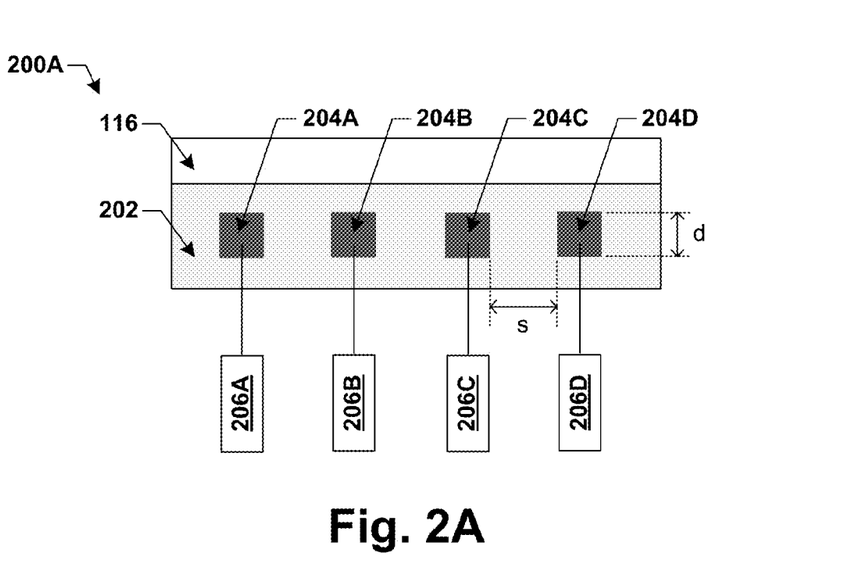
FIGS. 2A-2C illustrate some embodiments of a deformable reflective surface for EUV lithography comprising a mirror or reflective reticle.

FIG. 2A illustrates a side view of some embodiments of a first deformable reflective surface 200A, comprising a mirror 116 (e.g., one of the first through forth mirrors 116A-116D) disposed on a surface of a substrate 202. The substrate 202 comprises a plurality of cavities 204A-204D. Though shown as rectangles in FIG. 2A, the plurality of cavities 204A-204D include arbitrary geometries in various embodiments, with a dimension (d) and space (s) the order of microns (i.e., less than about 100 micrometers). In some embodiments, the substrate 202 is composed of an insulating material comprising an ultra low expansion (ULE) material such as silicate glass configured to exhibit minimal thermal expansion under elevated temperature. Each of the plurality of cavities 204A-204D is coupled to a deformation element 206A-206D configured to expand a volume of its respective cavity and consequently deform the mirror 116, as will be demonstrated in the embodiments of FIG. 2C.

In some embodiments, the deformation elements 206A-206D comprise individual gas sources configured to expand or contract the volume of the cavity by increasing or decreasing a pressure of a gas within the cavity, and consequently deform the mirror 116. In some embodiments, the gas sources comprise pure hydrogen, extreme-cleaned dry air (XCDA), or pure nitrogen.

In some embodiments, the plurality of cavities 204A-204D are filled with a resistive material, and the deformation elements 206A-206D comprise current sources configured to deliver an electric current to the resistive material within each cavity independently, resulting in a thermal expansion or contraction of the resistive material which increases or decreases the volume of each cavity. In some embodiments, the resistive material comprises silicon dioxide, copper, or aluminum.

In some embodiments the plurality of cavities 204A-204D are filled with a piezoelectric material and the deformation elements 206A-206D comprise current sources configured to deliver an electric current to the piezoelectric material within each cavity independently, resulting in an expansion or contraction of the piezoelectric material, which increases or decreases the volume of each cavity. In some embodiments, the piezoelectric material comprises $PbTiO_3$, $PbZrO_3$, etc.

Figure 2B:
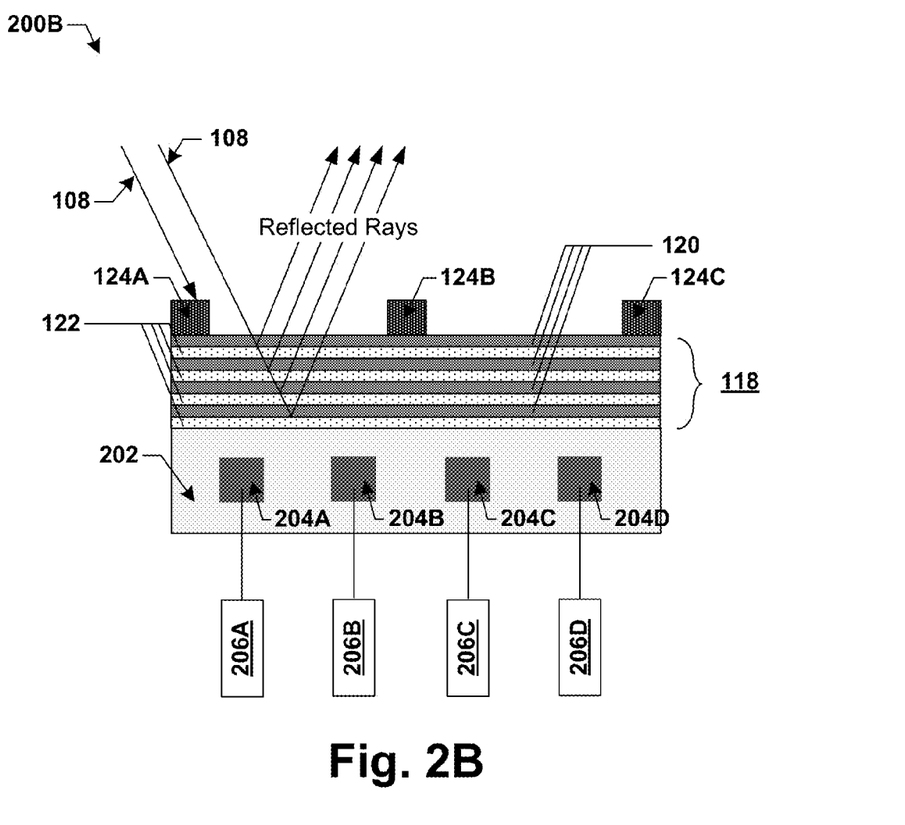

FIG. 2B illustrates a side view of some embodiments of a second deformable reflective surface 200B comprising a reflective reticle, further comprising a multilayer mirror 118 disposed on the substrate 202. The multilayer mirror 118 comprising a plurality of reflective layers 120 (e.g., Mo or Ru) separated by a plurality of spacer layers 122 (e.g., Si). The multilayer mirror 118 reflects the radiation 108 by means of Bragg interference. An incident ray of EUV radiation 108 is partially reflected and partially transmitted at interlayer interfaces formed between reflective layers 120 and spacer layers 122, resulting in a peak reflectance wavelength of the reflected rays of about a 13.5 nm. The second deformable reflective surface 200B operates in an analogous manner to the first deformable reflective surface 200A, as will be demonstrated in the embodiments of FIG. 2C.

Figure 2C:
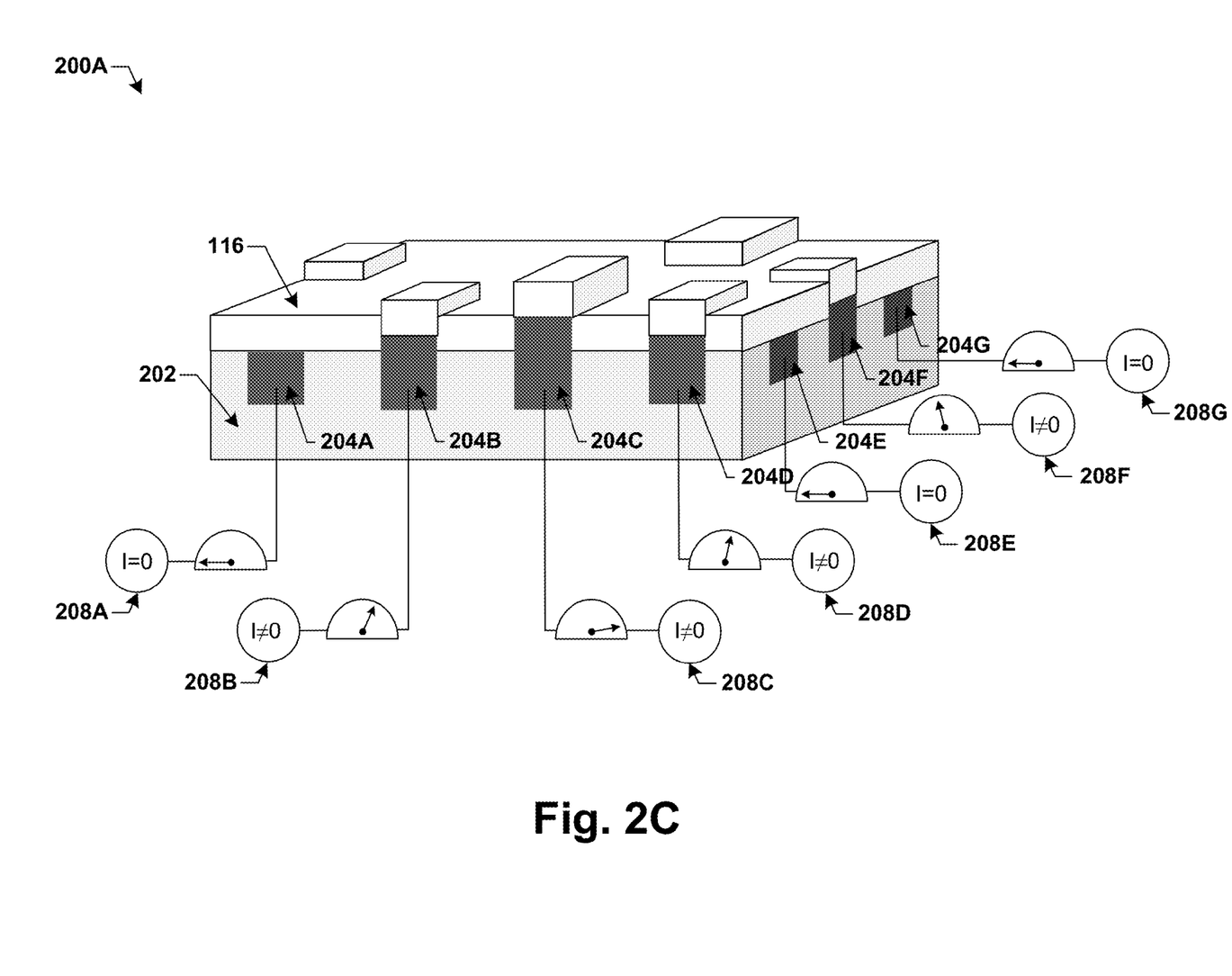

FIG. 2C illustrates some embodiments of a three-dimensional (3D) view of the first deformable reflective surface 200A, where each of a plurality of cavities 204A-204G are wired to a current source 208A-208G configured to independently deliver current to its corresponding cavity. In an inactive state, the current sources 208A-208G are configured to deliver no current (i.e., I=0) to the plurality of cavities 204A-204D, such that the mirror 116 conforms to the topology of the substrate 202. In various embodiments, the topology of the substrate 202 may be flat, curved (e.g., concave) in the case of a mirror 116 acting as a lens, etc. For the embodiments of FIG. 2C, the deformable reflective surface is in an active state, where a second current source 208B, a third current source 208C, a fourth current source 208D, and a sixth current source 208F supply current to a resistive or piezoelectric material residing within their corresponding cavities, resulting in an expansion of the material due to thermal or piezoelectric expansion, which locally changes a topology of the surface of the substrate 202 and the mirror 116.

FIG. 3A illustrates some embodiments of a deformable e-chuck 300 configured to hold and deform a reticle 104. The reticle 104 comprises a substrate 302 upon which reflective layers 120 and spacer layers 122 are disposed, and absorption features 124. Note that the substrate 302 is not deformable, as in the embodiments of FIGS. 2A-2C. For the embodiments FIGS. 3A-3B, deformation is achieved with the deformable e-chuck 300.

The deformable e-chuck 300 comprises a ULE substrate 304 which has been subjected to front-surface patterning to form first and second raised contact 306A, 306B on the front-surface. In some embodiments, ULE substrate 304 comprises silicate glass or ZERODUR. Surfaces of the first and second raised contact 306A, 306B are coated a ceramic material 308 (e.g., TiN). A back-surface of the ULE substrate 304 has been recessed directly opposite the first and second raised contact 306A, 306B to form a recess pattern that is substantially identical to a pattern formed by the first and second raised contacts 306A, 306B. The recessed areas of the back-surface are filled with a highly resistive (HRI) material 310 (e.g., lightly-doped silicon dioxide). The back surface has also been filled with a layer of ULE material 312 (e.g., silicate glass or ZERODUR).

First and second electrodes 314A, 314B have been disposed over the layer of ULE material 312, and within a dielectric layer 316. In some embodiments, the first and second electrodes 314A, 314B comprise copper (Cu). For the embodiments of FIGS. 3A-3B, the first and second electrodes 314A, 314B form a pattern that is substantially identical and is aligned to a pattern formed by the first and second raised contact 306A, 306B (i.e., the patterns are said to correspond to one-another). First and second electrical supplies 318A, 318B are then coupled to the HRI material 310 within the recessed areas on the back surface of the ULE substrate 302. The recessed areas comprise cavities within the combined ULE substrate 302 and ULE material 312, such that the first and second raised contacts 306A, 306B, the first and second electrodes 314A, 314B, and the cavities form corresponding patterns.

FIG. 3A illustrates some embodiments of the deformable e-chuck 300 of the present disclosure in an idle state, where no current is supplied to the HRI material 310. The reticle 104 is clamped by the deformable e-chuck 300 by an electrostatic potential 320 between the first and second electrodes 314A, 314B and the first and second raised contacts 306A, 306B. For the exemplary embodiments of FIG. 3A, the reticle 104 comprises a non-planar topography, resulting from a contaminant particle 322 residing on a surface of the first raised contact 306A. In other embodiments, the reticle 104 comprises a non-planar topography due to intrinsic warpage of the reticle 104, or other factors.

FIG. 3B illustrates some embodiments of the deformable e-chuck 300 in an active state, where a non-zero current has been applied to a region of the HRI material 310 over the second raised contact 306B by the second electrical supply 318B. Due to the high resistance of the HRI material 310, heating occurs in a vicinity of the second raised contact 306B, resulting in a thermal expansion of the HRI material 310, which increases a height of the second raised contact 306B relative to a front-surface of the ULE substrate 302, to achieve a substantially planar topography of the reticle 104. This expansion mitigates potential OVL error associated with the non-planar topography of the reticle 104. For the embodiments of FIGS. 3A-3B, no current is applied to a region of the HRI material 310 over a first raised contact 306A by the first electrical supply 318A. Therefore, there is no deformation of the first raised contact 306A. In general, an independent current may be applied to the HRI material 310 over each raised contact independently to control the topography of the reticle 104.

Figure 4:
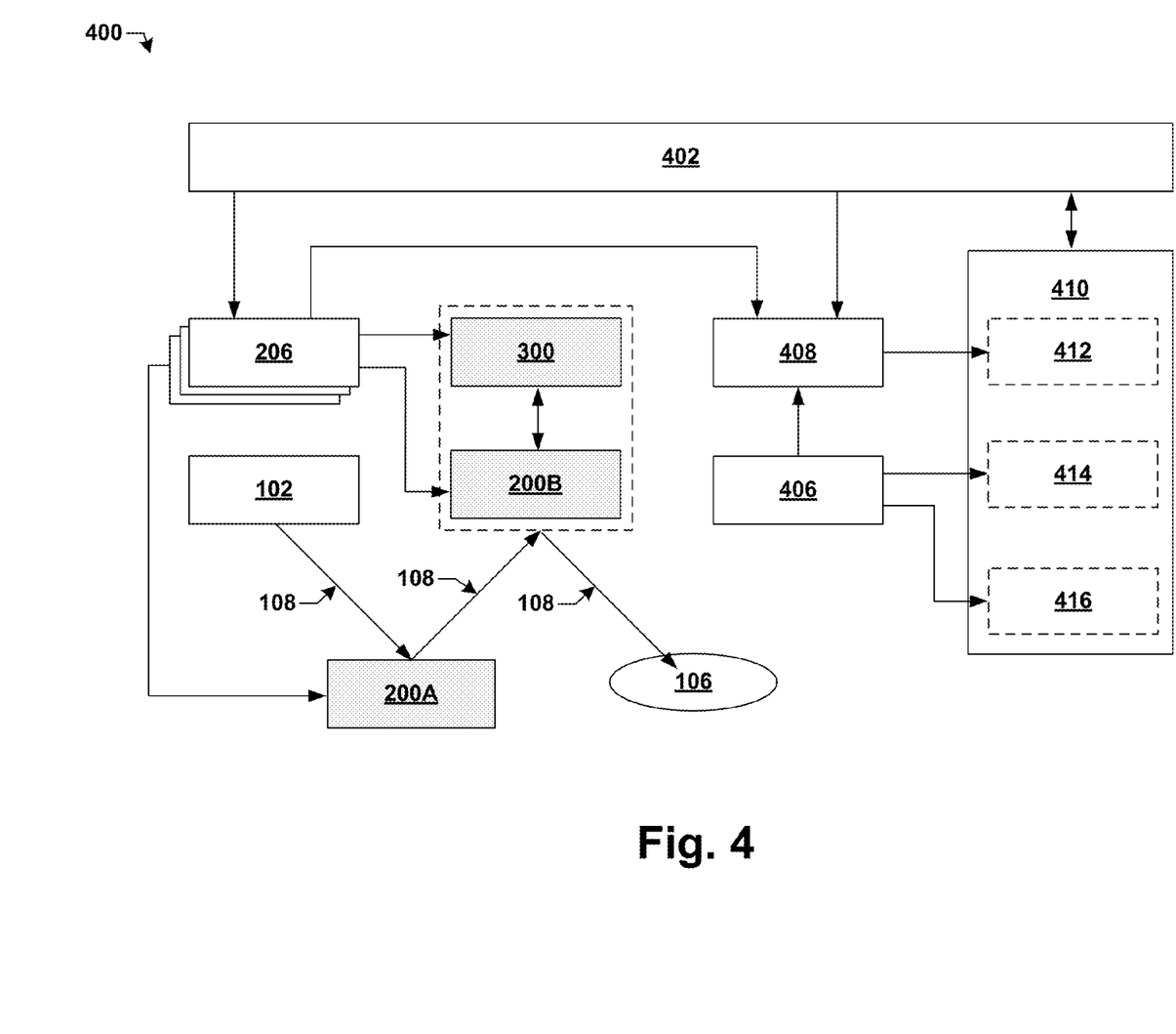
FIG. 4 illustrates some embodiments of a tool configuration for EUV lithography and metrology.

FIG. 4 illustrates some embodiments of a tool configuration 400 for EUV lithography and metrology. The tool configuration 400 comprises a radiation source 102 configured to transfer a reticle pattern to a semiconductor workpiece 106. The tool configuration 400 further comprises a plurality of deformation elements 206 configured to change a topology of a first or second deformable reflective surface 200A, 200B, or a deformable e-chuck 300. In some embodiments, the semiconductor workpiece 106 comprises a 300 mm or 450 mm Si or SOI wafer.

Note that while the first and second deformable reflective surfaces 200A, 200B and the deformable e-chuck 300 are all shown in the tool configuration 400, various embodiments will only utilize one of these components at a time. For instance, in some embodiments, the first deformable reflective surface 200A is utilized as a mirror (e.g., one or more of 116A-116D in FIG. 1), in conjunction with a non-deformable reticle (e.g., 104 in FIG. 1) and a non-deformable e-chuck, such that topographical corrections are made to the first deformable reflective surface 200A by the plurality of deformation elements 206. Alternatively, in some embodiments, the second deformable reflective surface 200B is utilized as a reflective reticle in conjunction with non-deformable mirrors (e.g., 116A-116D in FIG. 1) and a non-deformable e-chuck, such that topographical corrections are made to the second deformable reflective surface 200B. Finally, in some embodiments, a non-deformable reticle (e.g., 104 in FIG. 1) is coupled to the deformable e-chuck 300, and utilized in conjunction with non-deformable mirrors (e.g., 116A-116D in FIG. 1), such that topographical corrections are made to the deformable e-chuck 300 by the plurality of deformation elements 206.

The tool configuration 400 further comprises a metrology tool 406. To facilitate alignment of the reticle (200B) with the semiconductor workpiece 106, first alignment shapes are disposed on a surface of the semiconductor workpiece 106 in "white space" (i.e., unused wafer between reticle fields on the semiconductor workpiece 106), and corresponding second alignment shapes formed within the reticle pattern. In various embodiments, the metrology tool 406 is configured to measure a residual vector formed between a first shape of the semiconductor workpiece 106 and a second shape of the reticle pattern.

A controller 402 is coupled to the plurality of deformation elements 206 and the metrology tool 406. The controller 402 is configured to apply an independent voltage to each deformation element 216 in order to change the topology of the first or second deformable reflective surface 200A, 200B, or the deformable e-chuck 300. The controller 402 is further configured to apply the independent voltage based upon the residual vector, as will be demonstrated in greater detail in the embodiments of FIGS. 5A-5C and FIGS. 6A-6C. In some embodiments, a residual order performance index (ROPI) measurement is utilized to determine the voltages applied to the deformation elements 206.

In some embodiments, the controller 402 utilizes an automated process control (APC) architecture to compensate for defects within the first or second deformable reflective surface 200A, 200B, or clamping topography between a non-deformable reticle (104) and the deformable e-chuck 300, to offset wavefront aberration effects and OVL degradation. The APC architecture is configured to automatically adjust for OVL effects within an APC tuning range, above which human intervention is required.

The tool configuration 400 further comprises a calibration tool 408 which is coupled to the controller 402, and configured determine a magnitude of the residual vector (or ROPI) as a function of the independently applied voltage from the plurality of deformation elements 206. To achieve this, the plurality of deformation elements 206 are coupled to the calibration tool 408, which is in turn coupled to the metrology tool 406 to form a "feed-forward loop" to the controller 402.

During operation of the feed-forward loop, the reticle pattern is aligned to the semiconductor workpiece 106 using the deformable reflective surface (i.e., first or second deformable reflective surface 200A, 200B, or the deformable e-chuck 300), by increasing or decreasing a volume of each cavity within the substrate whereupon the deformable reflective surface is disposed. As a result, the topology of the deformable reflective surface is changed. In some embodiments, the volume of each cavity altered independently from one-another by applying an independent voltage to a resistive or piezoelectric material disposed within each cavity. The metrology tool 406 simultaneously measured a plurality of first residual vectors, and reports a total magnitude of the plurality of first residual vectors to the controller 402.

The feed-forward loop may also be utilized as a calibration loop. During a calibration step, each cavity of the substrate is independently deformed, and the deformation of each cavity is measured as a function of the applied voltage by the calibration tool 408 to create a calibration file 412. The calibration file 412 is then stored in a memory 410 for reference.

In the calibration loop mode of operation, the topology of the deformable reflective surface is systematically and iteratively altered by varying the independent voltage supplied by the plurality of deformation elements 206, until a total magnitude of the plurality of first residual vectors is minimized. The set of minimized first residual vectors is then stored in the memory 410 as a baseline overlay map 414, comprising a set of baseline vectors corresponding to the set of minimized first residual vectors.

In both the feed-forward loop and calibration loop mode of operation, the calibration tool 408 extracts voltage information from the plurality of deformation elements 206 and metrology data (e.g., residual vectors) from the metrology tool 406, and reports the voltage information and metrology data to the controller 402. Feed-back operation further comprises measuring a residual overlay map 416 comprising a plurality of second residual vectors by the metrology tool 406, and storing the residual overlay map 416 in the memory 410. The residual overlay map 416 is then compared to the baseline overlay map 414 to define an offset overlay map comprising a plurality of offset vectors. The plurality of offset vectors correspond to the pluralities of baseline vectors and second residual vectors. An offset vector may be added to its corresponding second residual vector to obtain their corresponding baseline vector. Offset overlay map analysis will be demonstrated in detail in the embodiments of FIGS. 6A-6C.

The controller 402 can then compensate for OVL effects by utilizing a "feed-forward loop." The feed-forward loop comprises the plurality of deformation elements 206 and the deformable reflective surface (200A, 200B, or 300), utilized in conjunction with information obtained from the feed-back loop. In a feed-forward mode of operation, the plurality of offset vectors are applied to the plurality of second residual vectors by deforming the deformable reflective surface to obtain the plurality of baseline vectors. To apply the plurality of offset vectors, the calibration file 412 is utilized to determine an applied voltage to each deformation element 206 based upon the offset overlay map.

Figure 5A:
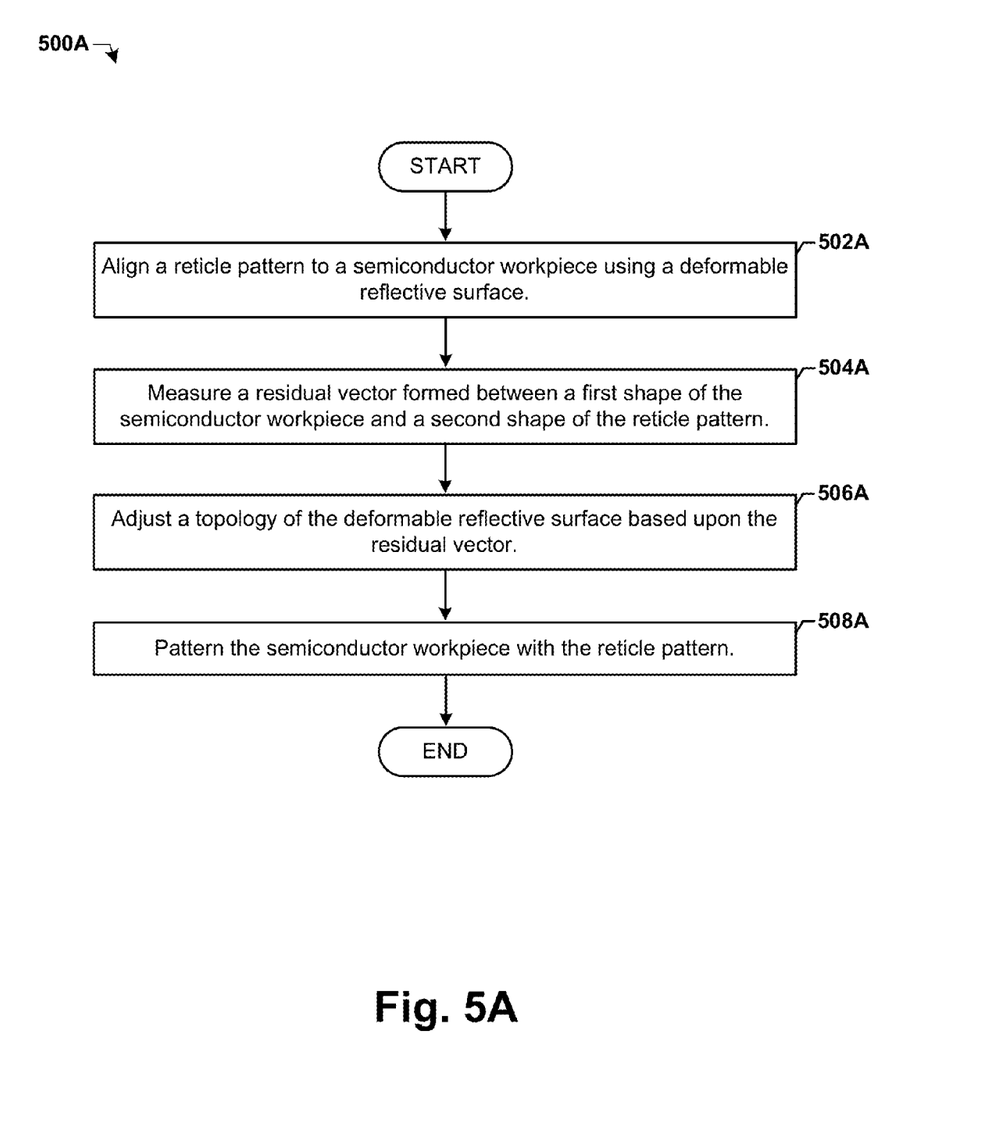
FIGS. 5A-5C illustrate some embodiments of a method of overlay control using a deformable reflective surface.
Figure 5B:
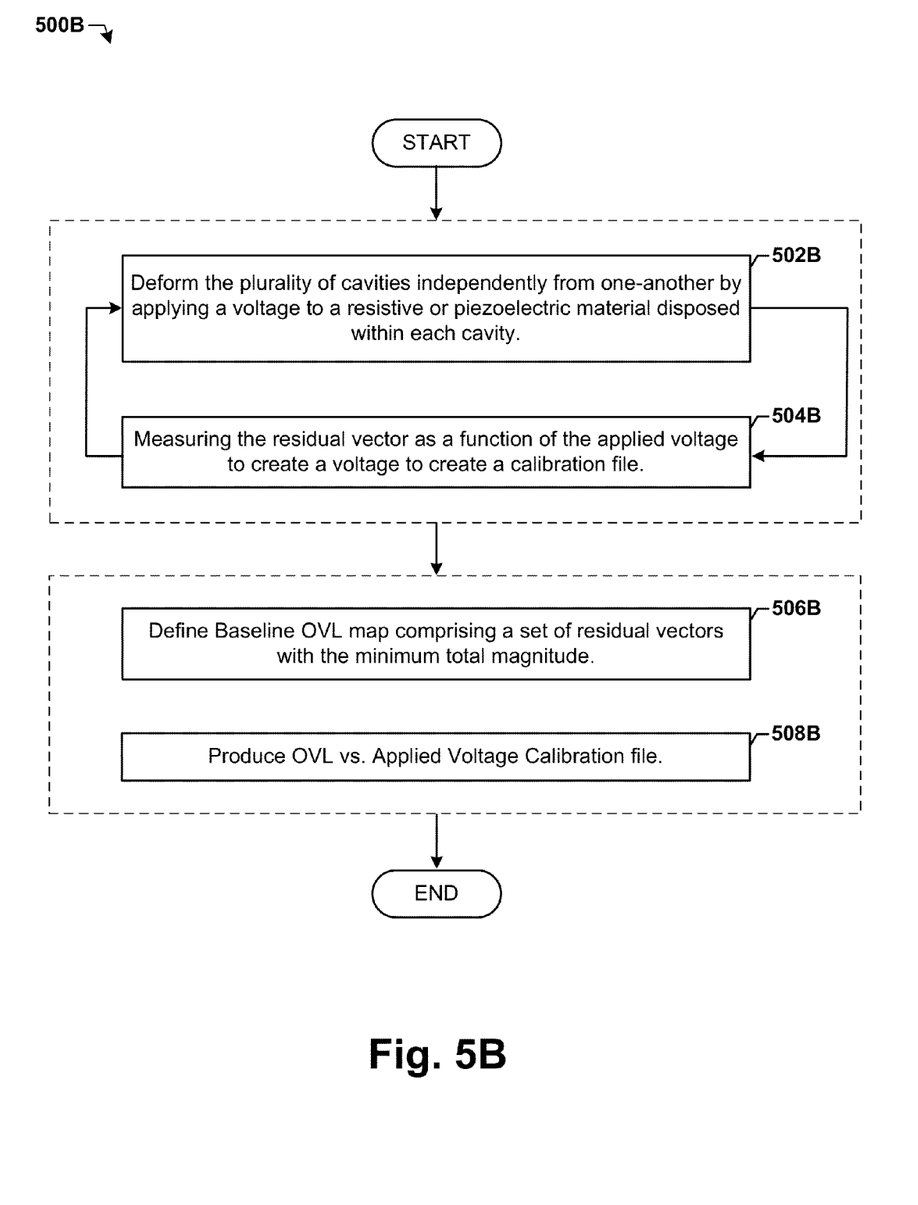
Figure 5C:
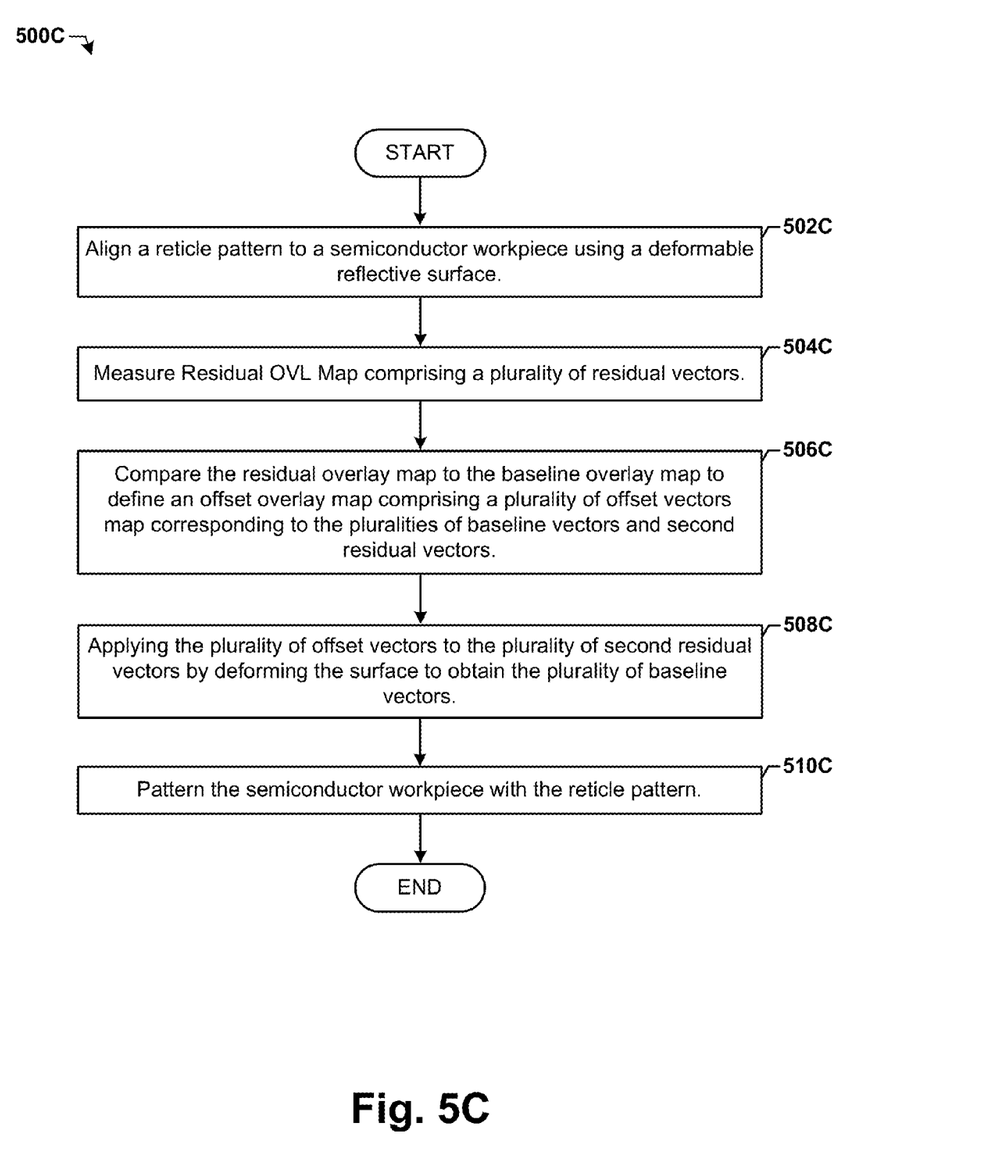

FIGS. 5A-5C illustrate some embodiments of methods 500A-500C of overlay control utilizing a deformable reflective surface. While the methods 500A-500C are illustrated and described as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

FIG. 5A illustrates some embodiments of a method 500A of overlay control. At 502A a reticle pattern is aligned to a semiconductor workpiece using a deformable reflective surface. In some embodiments, the deformable reflective surface is disposed on a substrate comprising a plurality of cavities. Each cavity is coupled to a deformation element comprising a source configured to increase or decrease a volume of the cavity. In these aforementioned embodiments, the deformable reflective surface comprises a mirror or reflective reticle disposed on the surface of the substrate. In some embodiments, the deformable reflective surface comprises a reticle coupled to a deformable electrostatic chuck comprising a plurality of electrodes, which are disposed within a dielectric layer on a surface of a substrate. In these embodiments, the pluralities of electrodes and cavities form corresponding patterns. Each cavity is again coupled to a deformation element comprising a source configured to increase or decrease a volume of the cavity, consequently deforming the surface of the substrate and the reticle.

At 504A a residual vector is measured. The residual vector is formed between a first shape of the semiconductor workpiece and a second shape of the reticle pattern.

At 506A a topology of the deformable reflective surface is adjusted based upon the residual vector. In some embodiments, the topology is adjusted by applying an independent voltage to a resistive or piezoelectric material disposed within each cavity, which increases or decreases a volume of each cavity, and subsequently adjusts the topology.

At 508A the semiconductor workpiece is patterned with the reticle pattern.

FIG. 5B illustrates some embodiments of a method 500B of calibrating the tool configuration 400 in accordance with the method 500A.

At 502B, after aligning a reticle pattern to a semiconductor workpiece using a deformable reflective surface, a plurality of cavities of a substrate are deformed to increase or decrease a volume of each cavity independently from one-another. The deformable reflective surface disposed on the substrate. By changing the volume of each cavity the surface of the substrate, the topology of the deformable reflective surface is consequently altered.

At 504B a plurality of first residual vectors are measured, where a first residual vector is formed between a first shape of the semiconductor workpiece and a second shape of the reticle pattern. The method 500B iterates between 502B and 504B, changing the topology of the deformable reflective surface and measuring the plurality of first residual vectors, across the full range on expansion and contraction of each cavity, and for a set of predetermined combinations of independent voltage to plurality of cavities, until the full range of each cavity and all combinations of independent voltage to each cavity have been recorded.

At 506B a baseline overlay map is defined by minimizing a total magnitude of the plurality of first residual vectors. The baseline overlay map comprises a plurality of baseline vectors corresponding to the minimized plurality of first residual vectors. In some embodiments, the baseline overlay map is defined by simply choosing the set of predetermined combinations of independent voltage which result in the smallest overall magnitude for the plurality of first residual vectors.

At 508A a calibration file is also formed by measuring the deformation of each of the plurality of cavies as a function of the applied voltage to each cavity for each iteration of 502B and 504B.

FIG. 5C illustrates some embodiments of a method 500C of overlay control in accordance with methods 500A and 500B.

At 502C a reticle pattern s aligned to a semiconductor workpiece using a deformable reflective surface.

At 504C a residual overlay map comprising a plurality of second residual vectors is measured.

At 506C the residual overlay map is compared to the baseline overlay map derived at 506B of method 500B. The comparison is utilized to define an offset overlay map. The offset overlay map comprises a plurality of offset vectors corresponding to the pluralities of baseline vectors and second residual vectors. An offset vector is defined to that it can be added to its corresponding second residual vector to obtain their corresponding baseline vector, as will be demonstrated in the embodiments of FIGS. 6A-6C.

At 508C the plurality of offset vectors are applied to the plurality of second residual vectors by deforming the surface to obtain the plurality of baseline vectors.

At 510C the semiconductor workpiece is patterned with the reticle pattern.

Figure 6A:
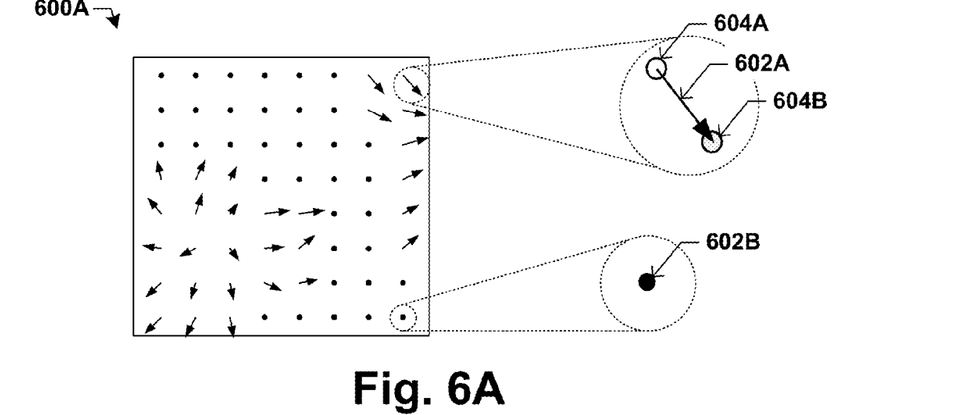
FIGS. 6A-6C illustrate some embodiments of defining an offset overlay map from a residual overlay map to obtain a baseline overlay map.
Figure 6B:
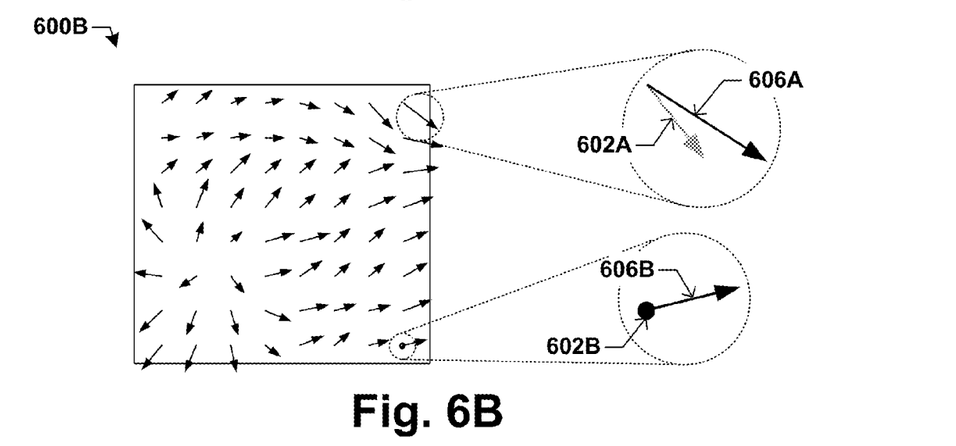
Figure 6C:
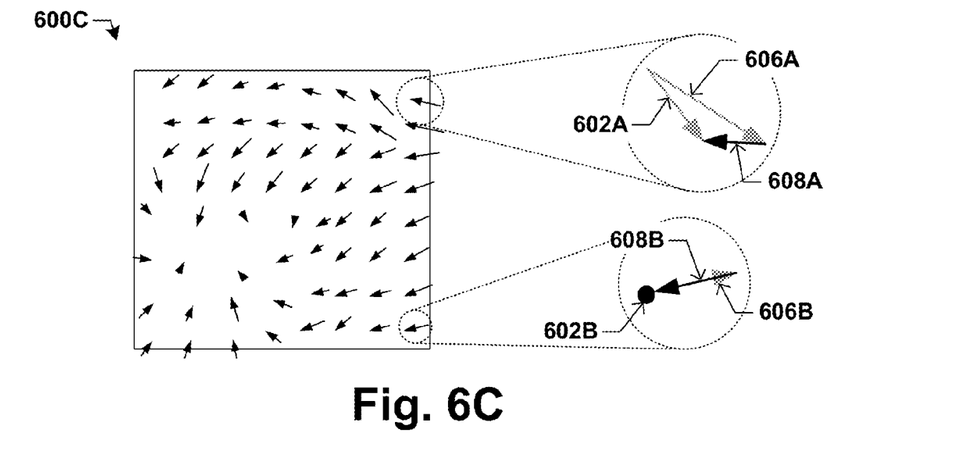

FIGS. 6A-6C illustrate some embodiments of defining an offset overlay map from a residual overlay map to obtain a baseline overlay map. FIG. 6A illustrates some embodiments of a baseline overlay map 600A formed at an initial wafer exposure. The baseline overlay map 600A comprises a plurality of first baseline vectors 602A formed between a first shape 604A of the semiconductor workpiece and a second shape 604B of the reticle pattern. A total magnitude of the plurality of first baseline vectors 602A is minimized by iteratively deforming the plurality of cavities of the substrate independently from one-another, while measuring a total magnitude of the plurality of first baseline vectors 602A, until the total magnitude of the first baseline vectors 602A is minimized. The baseline overlay map 600A also comprises a plurality of second baseline vectors 602B which have zero magnitude (i.e., the first shape 604A and the second shape 604B are essentially perfectly aligned in these regions).

FIG. 6B illustrates some embodiments of a residual overlay map 600B formed during a subsequent wafer exposure (i.e., after the initial wafer exposure). In some embodiments, the baseline overlay map 600A is defined by a tool configuration 400 prior to patterning of a plurality of wafers (e.g., a lot or several lots). During the subsequent patterning, defects within the deformable reflective surface or clamping topography due to contaminants within the e-chuck of the tool configuration 400 can cause wavefront aberration effects and result in OVL degradation. The residual overlay map 600B is measured in a same manner as the baseline overlay map 600B, but has a comprises first and second residual vectors 606A, 606B which differ from their corresponding first and second baseline vectors 602A, 602B, and comprise a larger overall magnitude due to the defects and contaminants.

FIG. 6C illustrates some embodiments of an offset overlay map 600C, comprising first and second offset vectors 608A, 608B. A first or second offset vector 608A, 608B is defined by comparing a first or second residual vector 606A, 606B to its corresponding first or second baseline vector 602A, 602B (i.e., an offset vector when added to its corresponding residual vector gives their corresponding baseline vector. Note that for a second baseline vector 602B with zero magnitude, the corresponding second offset vector 608B is the opposite of the second residual vector 606B. As such, if the baseline overlay map 600A were zero (i.e., comprising no residual alignment vectors due to 100% alignment), then the offset overlay map 600C would be the inverse of the residual overlay map 600B.

Therefore, it will be appreciated that some embodiments of the present disclosure relates to a tool configuration and method for EUV patterning with a deformable reflective surface comprising a mirror or reticle. A radiation source provides EUV radiation which is reflected off the deformable reflective surface to transfer a reticle pattern to a semiconductor workpiece. A metrology tool measures a residual vector formed between a first shape of the semiconductor workpiece and a second shape of the reticle pattern. And, a topology of the deformable reflective surface is changed based upon the residual vector to minimize a total magnitude of the residual vector.

In some embodiments the present disclosure relates to a metrology system, comprising a radiation source configured to transfer a reticle pattern from a reticle to a semiconductor workpiece. The metrology system further comprises a metrology tool configured to measure a residual vector formed between a first shape of the semiconductor workpiece and a second shape of the reticle pattern, and a plurality of deformation elements configured to change a topology of the deformable reflective surface based upon the residual vector.

In some embodiments the present disclosure relates to a method of overlay control, comprising aligning a reticle pattern to a semiconductor workpiece using a deformable reflective surface and measuring a residual vector formed between a first shape of the semiconductor workpiece and a second shape of the reticle pattern. The method further comprises adjusting a topology of the deformable reflective surface based upon the residual vector, and patterning the semiconductor workpiece with the reticle pattern.

In some embodiments the present disclosure relates to a method of overlay control, comprising measuring a residual overlay map comprising a plurality of second residual vectors. The method further comprises comparing the residual overlay map to the baseline overlay map to define an offset overlay map comprising a plurality of offset vectors corresponding to the pluralities of baseline vectors and second residual vectors, where an offset vector is added to its corresponding second residual vector to obtain their corresponding baseline vector. The method further comprises applying the plurality of offset vectors to the plurality of second residual vectors by deforming the surface to obtain the plurality of baseline vectors, and patterning the semiconductor workpiece with the reticle pattern.

Although the disclosure has been shown and described with respect to a certain aspect or various aspects, equivalent alterations and modifications will occur to others of ordinary skill in the art upon reading and understanding this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the disclosure. In addition, while a particular feature of the disclosure may have been disclosed with respect to only one of several aspects of the disclosure, such feature may be combined with one or more other features of the other aspects as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A metrology system, comprising:
   a radiation source configured to transfer a reticle pattern from a reticle to a semiconductor workpiece;
   a deformable reflective surface configured to reflect radiation carrying the reticle pattern;
   a metrology tool configured to measure a residual vector formed between a first shape of the semiconductor workpiece and a second shape of the reticle pattern; and
   a plurality of deformation elements configured to change a topology of the deformable reflective surface based upon the residual vector.

2. The metrology system of claim 1, further comprising a controller coupled to the plurality of deformation elements and metrology tool, and configured to apply an independent voltage to each deformation element to change the topology of the deformable reflective surface.

3. The metrology system of claim 2, further comprising a calibration tool coupled to the controller and configured to determine a magnitude of the residual vector as a function of applied voltage of a deformation element of the plurality of deformation elements.

4. The metrology system of claim 1, wherein the deformable reflective surface comprises a reticle coupled to a deformable electrostatic chuck comprising a plurality of electrodes which are disposed within a dielectric layer on a surface of a substrate, wherein the pluralities of electrodes and cavities form corresponding patterns, and wherein each cavity is coupled to a deformation element comprising a source configured to increase or decrease a volume of the cavity, deforming the surface of a substrate and reticle.

5. The metrology system of claim 1, wherein the deformable reflective surface is disposed on a substrate comprising a plurality of cavities, and wherein each cavity is coupled to a deformation element comprising a source configured to increase or decrease a volume of the cavity.

6. The metrology system of claim 5, wherein the deformable reflective surface comprises a mirror disposed on the surface of a substrate comprising a plurality of cavities and configured to reduce a size of the reticle pattern.

7. The metrology system of claim 5, wherein the deformable reflective surface comprises a reflective reticle.

8. The metrology system of claim 5, wherein the deformation element comprises a gas source configured to expand or contract the volume of the cavity by increasing or decreasing a pressure of a gas within the cavity, and consequently deform the deformable reflective surface.

9. The metrology system of claim 5, wherein the deformation element comprises a current source configured to deliver an electric current to a resistive material disposed within the cavity, resulting in a thermal expansion or contraction of the resistive material which increases or decreases the volume of the cavity.

10. The metrology system of claim 5, wherein the deformation element comprises a current source configured to deliver an electric current to a piezoelectric material within the cavity, resulting in an expansion or contraction of the piezoelectric material which increases or decreases the volume of the cavity.

11. A method of overlay control, comprising:
    aligning a reticle pattern to a semiconductor workpiece using a deformable reflective surface;
    measuring a residual vector formed between a first shape of the semiconductor workpiece and a second shape of the reticle pattern;
    adjusting a topology of the deformable reflective surface based upon the residual vector; and
    patterning the semiconductor workpiece with the reticle pattern.

12. The method of claim 11, wherein the deformable reflective surface is disposed on a substrate comprising a plurality of cavities, and wherein each cavity is coupled to a deformation element comprising a source configured to increase or decrease a volume of the cavity.

13. The method of claim 12, further comprising:
    iteratively deforming the plurality of cavities of the substrate independently from one-another while measuring a plurality of residual vectors until a total magnitude of the residual vectors is minimized; and
    defining a baseline overlay map comprising the minimized residual vectors.

14. The method of claim 13, further comprising:
    deforming a cavity by applying a voltage to a resistive or piezoelectric material disposed within the cavity; and
    measuring the deformation of the cavity as a function of the applied voltage to create a calibration file.

15. The method of claim 14, wherein adjusting the topology of the deformable reflective surface comprises:
- comparing a residual vector to its corresponding baseline vector to define an offset vector;
- referencing the calibration file to determine an applied voltage to each deformation element based upon the offset vector; and
- applying the voltage to each deformation element based upon the applied voltage referenced from the calibration file.

16. The method of claim 11, wherein the deformable reflective surface comprises a mirror disposed on the surface of a substrate comprising a plurality of cavities and configured to reduce a size of the reticle pattern.

17. The method of claim 11, wherein the deformable reflective surface comprises a reflective reticle whereupon the reticle pattern is disposed, the reticle further comprising a multilayer mirror comprising a plurality of reflective layers separated by a plurality of spacer layers.

18. The method of claim 11, wherein the deformable reflective surface comprises a reticle coupled to a deformable electrostatic chuck comprising a plurality of electrodes which are disposed within a dielectric layer on a surface of a substrate, wherein the pluralities of electrodes and cavities form corresponding patterns, and wherein each cavity is coupled to a deformation element comprising a source configured to increase or decrease a volume of the cavity, deforming the surface of a substrate and reticle.

19. A method of overlay control, comprising:
- aligning a reticle pattern to a semiconductor workpiece using a deformable reflective surface;
- deforming a plurality of cavities of a substrate whereupon a deformable reflective surface is disposed, to increase or decrease a volume of each cavity independently from one-another, and consequently deform a surface of the substrate by applying a voltage to a resistive or piezoelectric material disposed within each cavity;
- measuring a plurality of first residual vectors, wherein a first residual vector is formed between a first shape of the semiconductor workpiece and a second shape of the reticle pattern; and
- minimizing a total magnitude of the plurality of first residual vectors by an iterative deformation of the surface to define a baseline overlay map comprising a plurality of baseline vectors corresponding to the minimized plurality of first residual vectors.

20. The method of claim 19, further comprising:
- measuring a residual overlay map comprising a plurality of second residual vectors;
- comparing the residual overlay map to the baseline overlay map to define an offset overlay map comprising a plurality of offset vectors corresponding to the pluralities of baseline vectors and second residual vectors, wherein an offset vector is added to its corresponding second residual vector to obtain their corresponding baseline vector;
- applying the plurality of offset vectors to the plurality of second residual vectors by deforming the surface to obtain the plurality of baseline vectors; and
- patterning the semiconductor workpiece with the reticle pattern.

* * * * *